United States Patent [19]

Lampe et al.

[11] 4,112,456

[45] Sep. 5, 1978

[54] STABILIZED CHARGE INJECTOR FOR CHARGE COUPLED DEVICES WITH MEANS FOR INCREASING THE SPEED OF PROPAGATION OF CHARGE CARRIERS

[75] Inventors: Donald R. Lampe, Ellicott City; Marvin H. White, Laurel; Arthur S. Jensen, Baltimore, all of Md.

[73] Assignee: Westinghouse Electric Corp., Pittsburgh, Pa.

[21] Appl. No.: 625,701

[22] Filed: Oct. 24, 1975

Related U.S. Application Data

[63] Continuation-in-part of Ser. No. 507,115, Sep. 17, 1974, abandoned.

[51] Int. Cl.² .................................................. H01L 29/78
[52] U.S. Cl. .................................. 357/24; 307/221 D; 365/183
[58] Field of Search ......... 357/24; 307/221 C, 221 D; 340/173 R

[56] References Cited

U.S. PATENT DOCUMENTS

| | | | |
|---|---|---|---|
| 3,654,499 | 4/1972 | Smith | 357/24 |
| 3,656,011 | 4/1972 | Weinberg | 357/24 |
| 3,986,198 | 10/1976 | Kosonocky | 357/24 |

OTHER PUBLICATIONS

R. Krambeck et al., "A Doped Surface Two-Phase CCD," Bell Sys. Tech. J., vol. 51, No. 8, Oct. 1972, pp. 1849–1866.

C. Sequin, "Interlacing in Charge-Coupled Imaging Devices," IEEE Trans. on Elec. Dev., vol. ed-20, No. 6, Jun. 1973, pp. 535–541.

M. White et al., "Study in the Use of Charge-Coupled Devices in Analog Signal Processing Systems-Final Report," Naval Research Laboratory, May 1974, pp. 3-8 to 3-11.

J. Carnes et al., "Measurements of Noise in Charge-Coupled Devices," RCA Review, vol. 34, Dec. 1973, pp. 553–565.

Primary Examiner—Joseph E. Clawson, Jr.
Attorney, Agent, or Firm—H. W. Patterson

[57] ABSTRACT

A stabilized charge injector for charge coupled devices (CCD) includes a diffusion and two or more gate structures in a CCD channel wherein the diffusion alternately acts as a source and drain of the minority-type signal carriers. D.C. signals are applied to the gates immediately adjacent the diffusion and the next successive adjacent gate to provide a charge injection which is proportional to the difference between the signal voltage applied to the one of the two gates and a DC reference voltage applied to the other thereof. Low noise performance is achieved through utilization of a quasistatic operation in which neither of the aforementioned gates adjacent the diffusion is pulsed. Moreover, the use of a gate injector presents at the input, a true capacitance defined as a function of the gate oxide layer. Hence, the value of capacitance is constant and independent of the signal voltage applied. A stabilized charge injector structure is disclosed providing a large value of capacitance for minimizing noise in the injection operation, and wherein problems otherwise arising out of the large size of the capacitance as to adequate speed of propagation of charges from the capacitance to a CCD charge transfer structure are overcome by special gate electrode structures and pulsing techniques to provide successive pushes of the charge being injected from the gate capacitance into the receiving CCD transfer device. The stabilized charge injector may be used for either serial or parallel injection into a CCD channel and its advantages most fully being realized in the parallel input mode; operating waveforms for the charge injector to provide parallel injection into a CCD channel during each shift cycle thereof and, alternatively, to provide selectively timed parallel charge injection in successive intervals are disclosed.

14 Claims, 41 Drawing Figures

▦ EXCESS CHARGES, SCUPPERED TO SET(+) SIGNAL CHARGE LIMIT.

▨ SIGNAL CHARGES

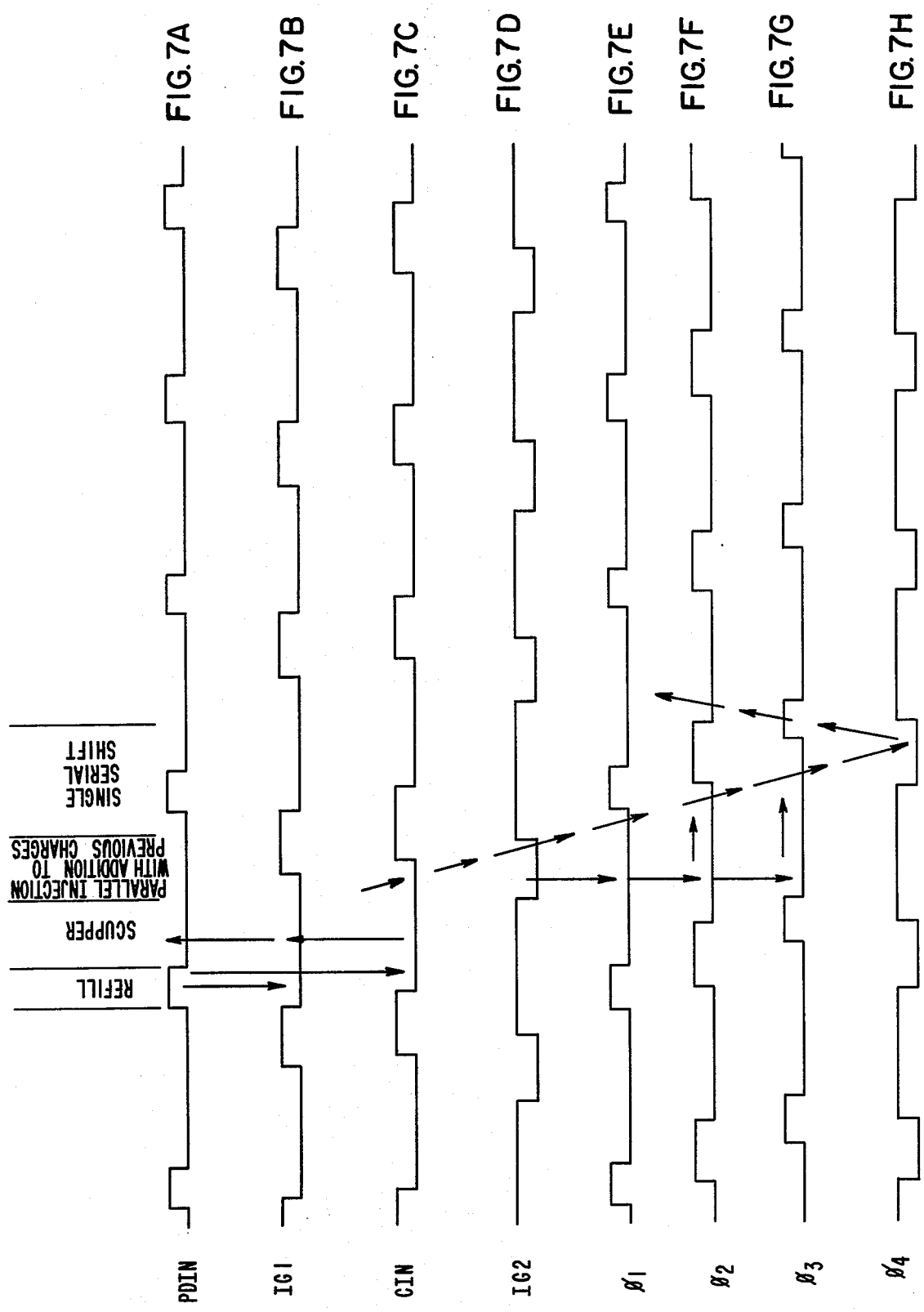

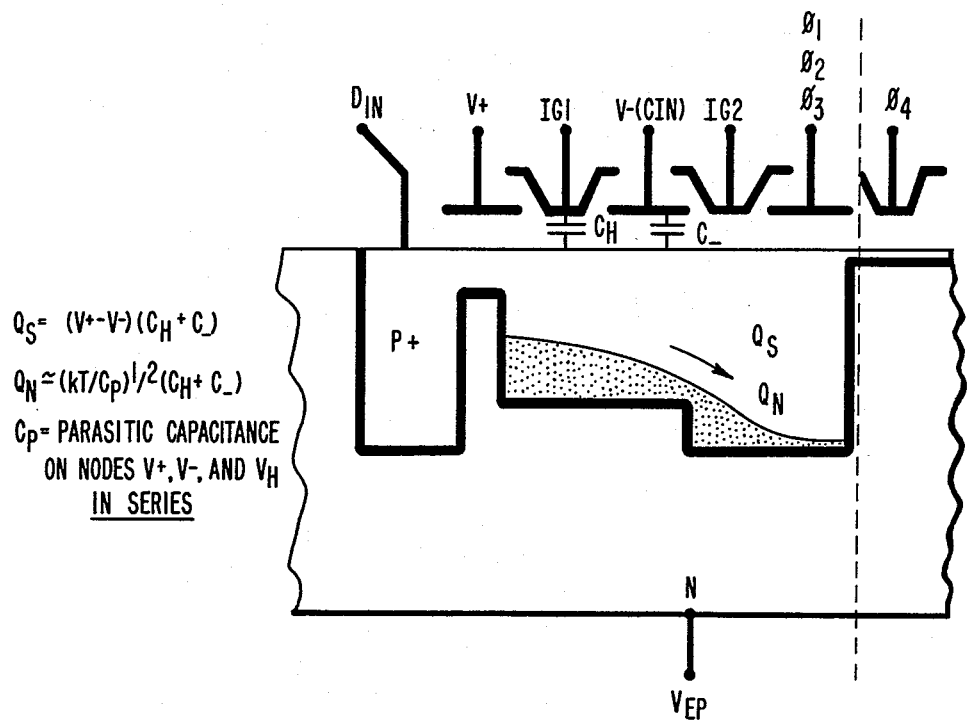
FIG.8
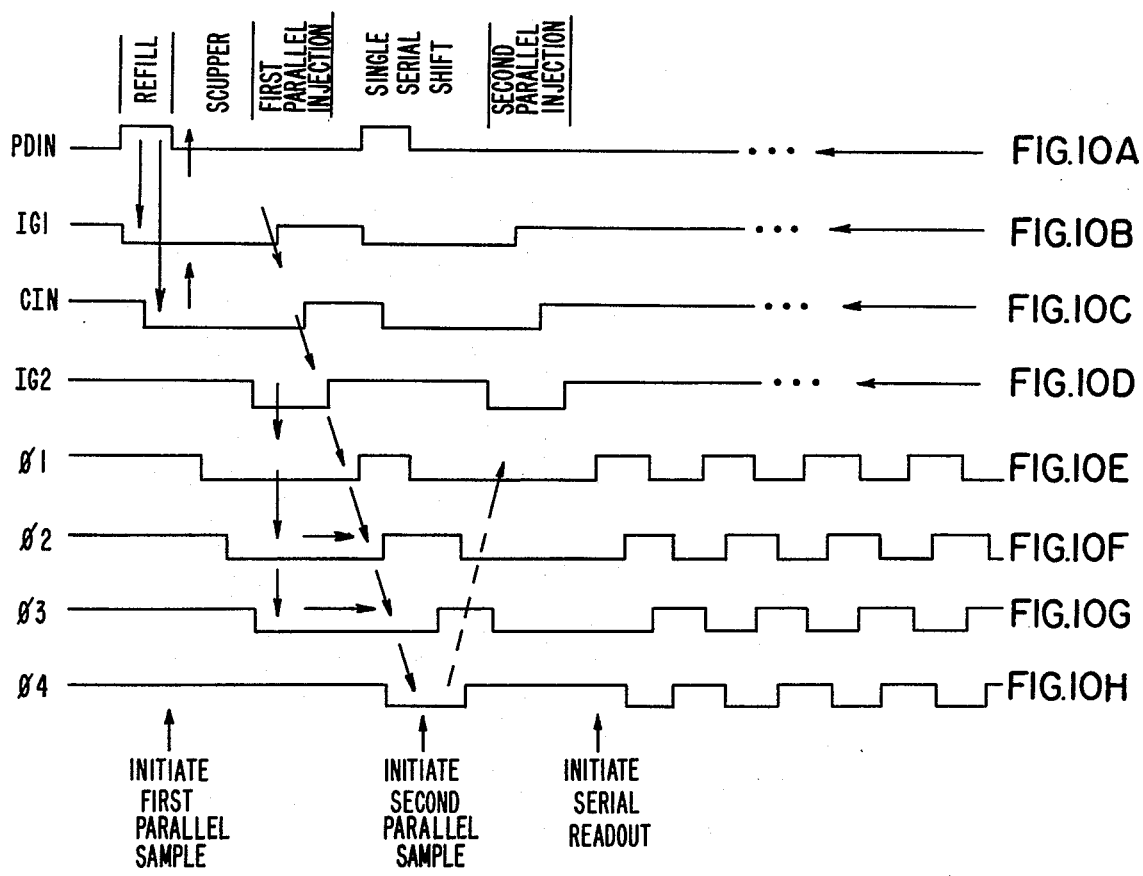

STABILIZED CHARGE INJECTOR FOR CHARGE COUPLED DEVICES WITH MEANS FOR INCREASING THE SPEED OF PROPAGATION OF CHARGE CARRIERS

CROSS-REFERENCE TO PARENT APPLICATION

This is a continuation-in-part of application Ser. No. 507,115 filed Sept. 17, 1974, entitled A PROGRAMMABLE ANALOG TRANSVERSAL FILTER, assigned to the common assignee hereof, now abandoned.

BACKGROUND OF THE INVENTION

This invention relates to charge transfer devices (CTD) and charge couple devices (CCD) and, more specifically, to a stabilized charge injector (SCI) for use with such devices.

State of the Prior Art

In the prior art, digital signal processing (DSP) has been utilized in many applications in view of the low cost of the integrated circuits that are available to perform many functions in digital fashion. As compared with analog techniques, DSP has been preferred in that its use of digital implemenation has been considered to be preferable in view of cost, weight, flexibility and accuracy considerations. By contrast, the only present advantage of analog techniques is its lower power consumption, which advantage may gradually disappear as technology advances. A further technique known as discrete analog signal processing (DASP) provides an alternative to the aforementioned methods of signal processing and is implemented by sampling at regular intervals an analog signal to provide a series of analog signals or bits, each of which may be operated upon one-at-a-time and have an amplitude containing information on data corresponding to M digital bits, where one bit of resolution in DSP is equivalent to 6dB dynamic range in the analog signal. Experiments have shown that a signal-charge analog packet can be shifted through a typical CCD nearly unattenuated, limited by the size of the holding wells and the minimum detectable output signal.

As more fully described in an article entitled, "Charge Coupled Semiconductor Devices" in *Bell System Technical Journal*, April 1970 by W. S. Boyle and G. E. Smith, CCD's sample an analog input signal to provide a series of analog bits to be stored in potential wells created at the surface of a semiconductor and transported along the surface by timing or signals. More particularly, these charges constitute minority carriers stored at the silicon-silicon dioxide interface of MNOS non-memory capacitors and are trasferred from capacitor or well to capacitor or well on the same substrate by manipulating the voltages applied across the capacitor.

To date, low-noise charge injection into CCD's is achieved by two basic techniques — one involves a floating junction which can inject only small quantities of charge linearly or large charge packets non-linearly. A second technique can inject only small charge packets linearly with low noise or large packets at the price of increased noise. The latter technique involves typically a diffusion charge injector structure which is operated as a reverse biassed diode. The capacitance value of the diode in this instance is a function of the level of signal voltage applied. Hence, the prior art diffusion-type charge injector structure introduces non-linearities and noise in the charge injection function as a result of the signal voltage-dependent capacitance value thereof.

Low noise charge injection is extremely important to proper operation of CCD structures, since for signal processing the charge injection is controlled by electrical injection, not optical injection. In general, the prior art has not provided adequate charge injection techniques or structures affording sufficient stability and linearity to meet the demands of CCD systems.

SUMMARY OF THE INVENTION

It is accordingly an object of this invention to afford a technique for low noise charge injection into CCD structures.

Another object of the invention is to provide a device capable of electrically injecting charge into any charge transfer device (CTD) with very low noise.

Still a further object of the invention is to provide a device capable of electrically injecting charge into any charge transfer device (CTD) which is linearly proportional to the applied signal voltages, yet a further object being affording the additional capability of injecting a charge packet equal to the largest charge handling capability of the associated signal charge device.

In general, the object of the invention is to provide improved charge injection operation and an improved charge injection structure, commonly referred to herein as a stabilized charge injector, or injection, as to the structure and function, respectively and hereinafter designated SCI.

More specifically, the stabilized charge injector (SCI) of the invention includes a diffusion and two or more gate structures in a CCD channel wherein the diffusion alternately acts as a source and drain of the minority type signal carriers. Signals are applied to the gates immediately adjacent the diffusion and the next successive adjacent gate to provide a charge injection which is proportional to the difference between the signal voltage applied to the one of the two gates and a DC reference voltage applied to the other thereof. Low noise performance is achieved through utilization of a quasistatic operation in which neither of the aforementioned gates adjacent the diffusion is pulsed. Moreover, the use of a gate injector in accordance with the invention presents at the input a capacitance defined as a true capacitance as a function of the gate oxide layer and hence the value of capacitance is constant and independent of the signal voltage applied. Conversely, and as noted above, diffusion charge injector structures each operate as a reverse biased diode, the capacitance value of which is a function of the level of signal voltage applied and thereby introduce additional nonlinearities and noise in the charge injection function.

BRIEF DESCRIPTION OF THE DRAWINGS

FIGS. 7A through 7H comprise wave forms relating to the operation of the structure of FIGS. 6A and 6B, indicating a first mode of operation of that structure;

FIG. 8 is a schematic cross-sectional illustration along the line 8—8 in FIG. 6A;

FIGS. 10A through 10H comprise wave forms for an alternative mode of operation of the structure of FIG. 6A.

DETAILED DESCRIPTION OF THE PREFERRED EMBODIMENTS

Figure 1:
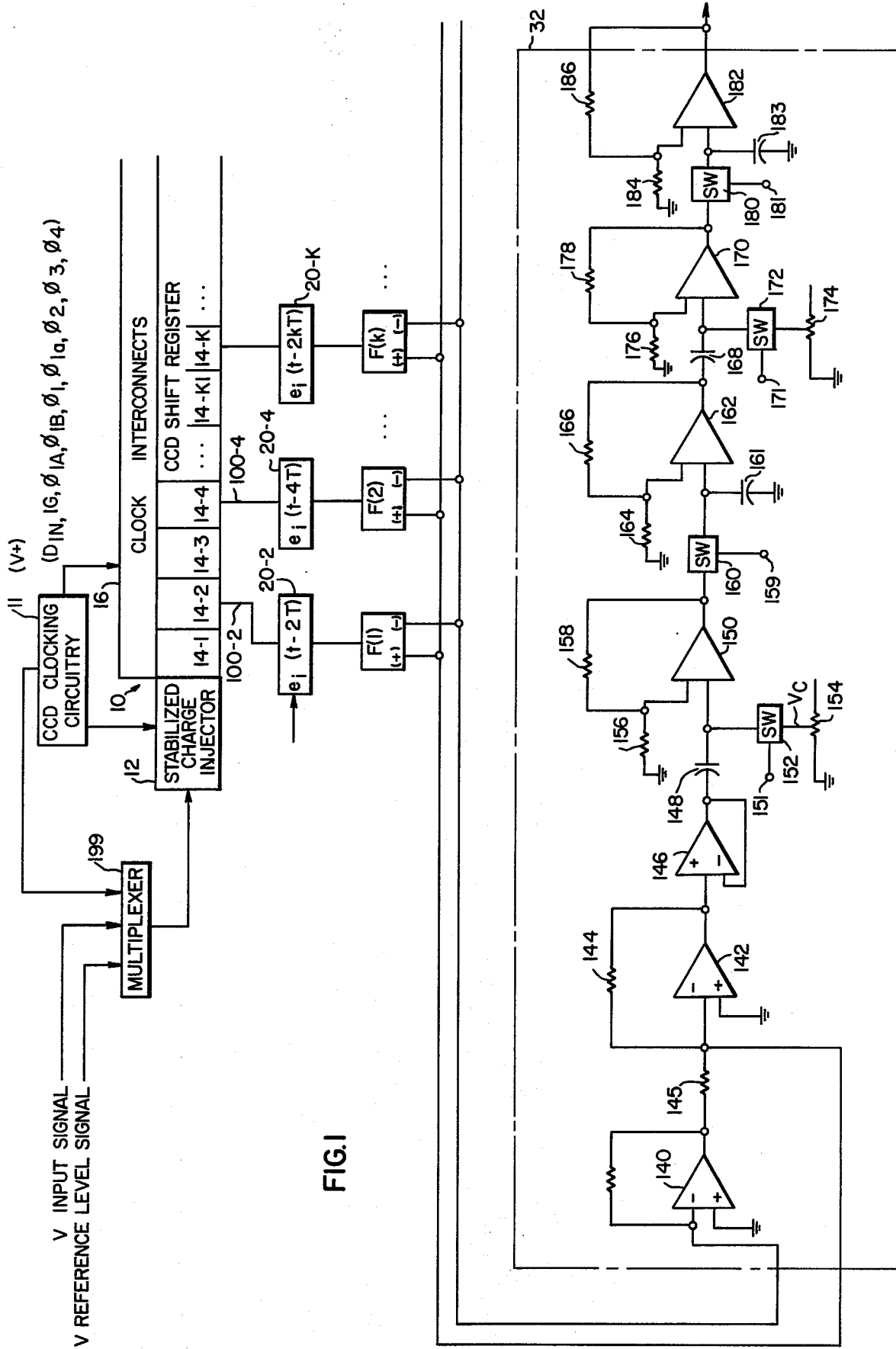
FIG. 1 is a simplified block diagram of a CCD shift register and associated clocking circuitry and having a serial input stabilized charge injector in accordance with the invention.

FIG. 1 of the drawings illustrates in schematic form a discrete analog processing system in accordance with the teachings of this invention and comprising a charge transfer device illustratively taking the form of a charge coupled device 10 (CCD) and including a stabilized charge injector 12 for injecting the input signal charges into the CCD 10. A CCD master clock circuit 11 provides suitable clock signals for operation of the injector 12 and the CCD shift register 10 through the clock interconnects 16, in known fashion. The clocking circuitry 11 provides a number of output signals as indicated in FIG. 1, including four-phase clocks $\phi 1$ through $\phi 4$. These various signals are shown and discussed in relation to FIGS. 4A through 4J.

The CCD register 10 includes a plurality of stages through which the charge packets are propagated under control of the clocking signals, those stages being shown as 14-1, 14-2, ... in FIG. 1.

Figure 2:
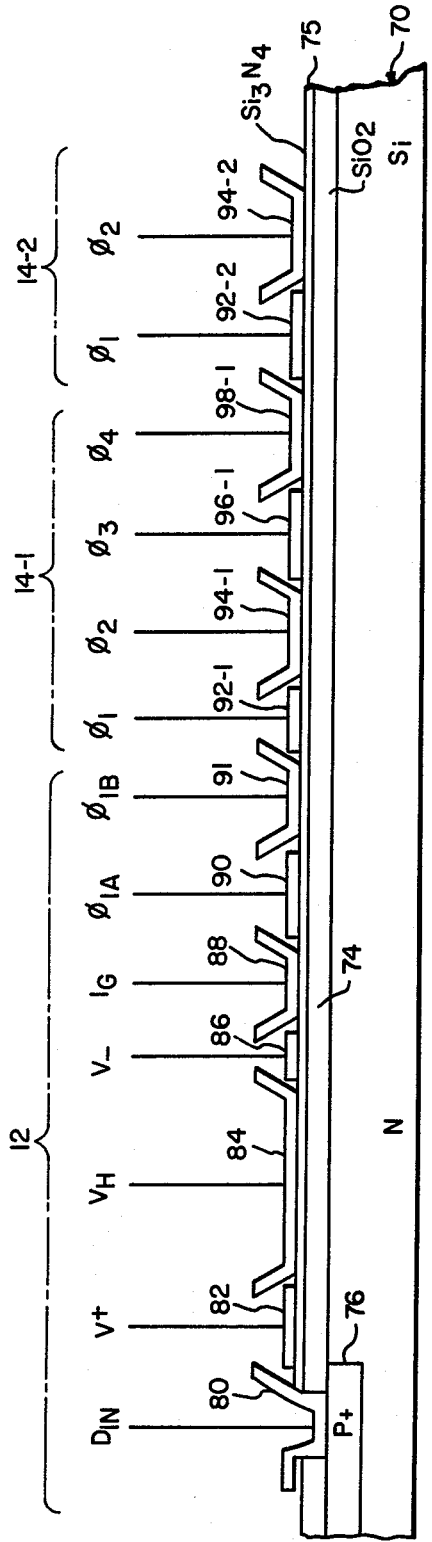
FIG. 2 is a schematic cross-section of the stabilized charge injector and a portion of the CCD shift register channel as shown in FIG. 1.

FIG. 2 is a schematic cross-sectional view of the stabilized charge injector 12 and the first two stages 14-1 and 14-2 of the CCD shift register 10 of FIG. 1. As shown, a substrate 70 of silicon (which may be an epitaxial layer on a further substrate) includes a P+ type source/drain region 76 formed within the substrate 70 and a source/drain electrode 80 formed through a window in the silicon dioxide layer 74 and the silicon nitride layer 75, in direct contact with the region 76. Linearity of signal injection is achieved primarily through the use of the additional electrodes 80, 82, 84, 86 and 88, to which the biasing potentials V+, $V_H$ and V− are applied. Generally, the voltage signals V+ and V− as shown in FIGS. 4C and 4D, respectively, establish a charge distribution as seen in FIGS. 3A to 3D within the silicon substrate layer 70. In particular, the input signal is applied to either the V+ electrode 82 or the V− electrode 86, for the control of the injection of the charge packets into the first and subsequent wells of the CCD 10. $\phi_{1A}$ and $\phi_{1B}$ electrodes are provided to facilitate the injection of the large amounts of charge needed for the maximum allowable propagating charge packet, $Q_{MAX}$. The injected charge then is transferred successively beneath the $\phi 1$, $\phi 2$, $\phi 3$ and $\phi 4$ electrodes of the successive groups 14 to be transferred along the length of CCD 10. The various signals as applied to the electrodes of the stabilized charge injector 12 as well as the shift register portion of the CCD 10 are shown in FIGS. 4A to 4J.

Figure 3A:
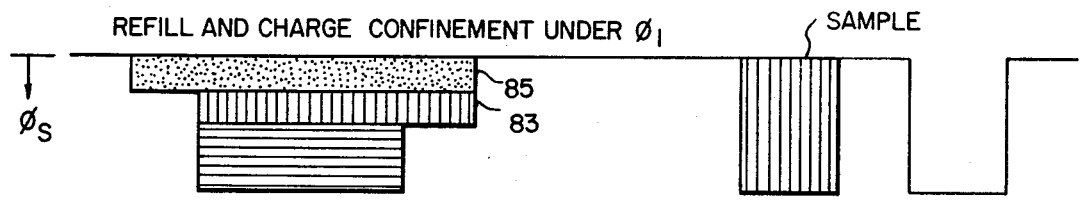
FIGS. 3A through 3D are illustrative wave forms representing charge conditions in the potential wells associated with the stabilized charge injector.
Figure 4A:
FIGS. 4A through 4J are wave forms indicating control voltages and clocking potentials applied to the CCD shift register and stabilized charge injector of FIG. 1 and FIG. 2 for explaining the operation thereof.

The first refill step of injecting the signal into the CCD 10 is shown in FIGS. 3A and 4A by pulsing the source/drain electrode 80 to the potential of the substrate 70 wherein the source/drain region 76 acts as a source of minority charges 72. During the refill phase as shown in FIG. 3A, the charge uncertainty is limited by the following equation:

$$q_n^2 = kT(C_+ + C_H + C_-) \tag{3}$$

Figure 3B:
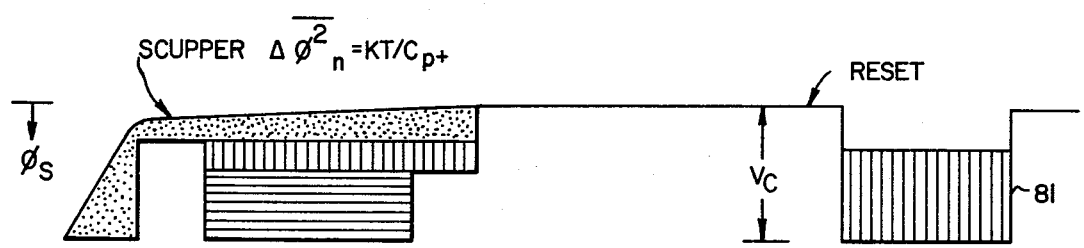

These charge flunctuations are meaningless since in the next step as shown in FIG. 3B, the minority carriers near that charge level are drained or "scuppered" from the upper part 85 of the well established beneath the electrodes 84 and 86 back into the source/drain region 76, which now is reversebiased to function as a drain, until the charge level within the well 83 underneath the electrodes 84 and 86 reaches the voltage level as applied to the V+ gate electrode 82. In other words, all of the excess charges including those which give rise to the population variation or randomness as expressed in equation (3), are scuppered into the drain region 76 until the surface potential at the $V_H$ and V− electrodes 84 and 86 equals the surface potential underneath the V+ electrode, which has noise flunctiatons given by the equation:

$$\Delta \phi n^2 = kT/C_{P+} \tag{4}$$

where $C_{P+}$, $C_{P-}$ and $C_{PH}$ equal the total on-chip plus off-chip capacitances at the nodes associated with the V+ electrode 82, the V− electrode 86 and the $V_H$ electrode 84, respectively.

As seen in FIG. 2 and 4A, the source diffusion 76 is biased by the voltage applied to the electrode 80, whereby all the minority carriers near the charge level as given in the equation (3) within the well formed beneath the electrodes 82, 84 and 86 as shown in FIG. 3B, are drained or "scuppered" back into the diffusion region 76. At the end of the "scupper" process, the excess or random charges have been removed from this uppermost part 85 of the well beneath the electrodes 82, 84 and 86.

Figure 4B:
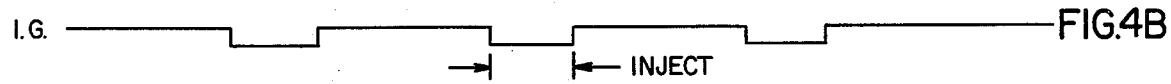
Figure 4C:
Figure 4D:

Next, the injection gate is enabled by applying a negative-going inject pulse IG as shown in FIG. 4B to the injection gate electrode 88, whereby positive charges are permitted to flow into the first receiving well 89 beneath the IG electrode 88, the $\phi_{1A}$ electrode 90 and $\phi_{1B}$ electrode 91, and $\phi_1$ electrode 92-1. The minority carriers continue to flow until the surface potential beneath the $V_H$ electrode 84 equals the surface potential beneath the electrode V− (86), which has a potential noise fluctuation in accordance with the equation:

$$\Delta \phi_n^2 = kT/C_{P-} \tag{5}$$

Electrode 84 may be electrically connected to electrode 86 or an independent negative voltage may be applied to electrode 84 to establish a depletion region which acts as a minority carrier holding well 93. During this injection period, any potential fluctuation on the $V_H$ electrode 84 injects undesired charge randomness given by the equation:

$$q_n = C_H \cdot \Delta\phi_n, \text{ where } \Delta\phi_n^2 = kT/C_{PH} \tag{6}$$

Figure 3C:
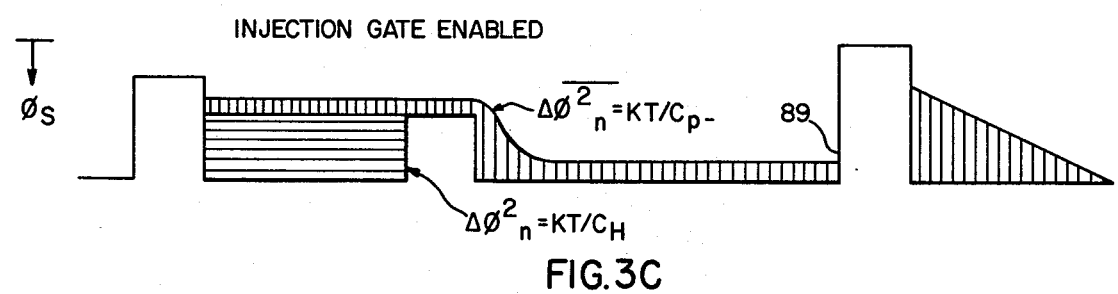

The input signal as shown in FIG. 4D may be applied to either the V+ electrode 82 or the V− electrode 86 whereby the quantity of charges permitted to flow into the well 89 is controlled as shown in FIG. 3C. Further, equations (4), (5) and (6) as given above may be expressed as follows:

$$Q_{SIG} = (C_H + C_-)(V_+ - V_-) \tag{7}$$

and $$q_n^2 = (C_H + C_-)^2 \cdot (kT/C_{P+}) + (C_H + C_-)^2 \cdot (kT/C_{P-}) + C_H^2 \cdot (kT/C_{PH}) \tag{8}$$

(or)

$$q_n^2 = (C_H + C_-)^2 \cdot kT \cdot (C_{P+}^{-1} + C_{P-}'^{-1} + C_{PH}^{-1}) \tag{9}$$

The last factor of equation (9) is simply the equivalent series combination of the total off-chip parasitic and on-chip capacitance at the V+ electrode 82, $V_H$ electrode 84 and V− electrode 86, which may be expressed by the term $C_P$, permitting the following equation:

$$q_n = (C_H + C_-) \cdot (kT/C_P)^{\frac{1}{2}} \tag{10}$$

Figure 4E:
Figure 4F:
Figure 4G:
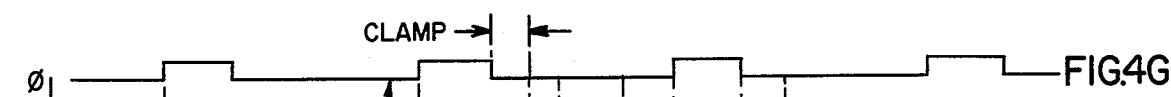
Figure 4H:
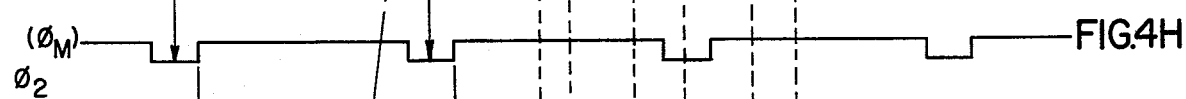
Figure 4I:
Figure 4J:
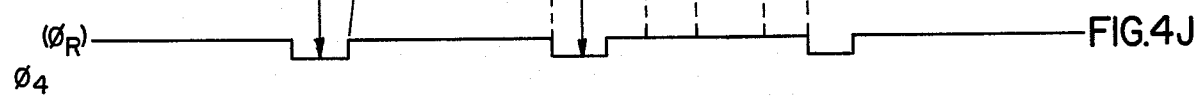

In FIG. 2, there is shown electrodes $\phi_{1A}$ and $\phi_{1B}$ (90 and 91) which facilitate the injection of large amounts of charge into the well 89 therebeneath to permit the maximum allowable propagating charge packet $Q_{MAX}$. As seen in FIGS. 4E and 4F, negative-going pulses are applied to the electrodes 90 and 91 during the injection step, whereby a maximum amount of charges are disposed in the well 89. If $V_C$ denotes the surface potential differences generated by the clock signals $\phi_1$ to $\phi_4$ and $V^1$ indicates the surface potential when $Q_{MAX}$ is disposed within the region 89 underneath electrodes 91 and 92, the following relationship is obtained:

$$Q_{MAX} = C_1 \cdot V_C = (C_H - C_-)(V_+ = V_-) = (C_{1A} + C_1) \cdot (V_C - V^1) \tag{11}$$

Figure 3D:
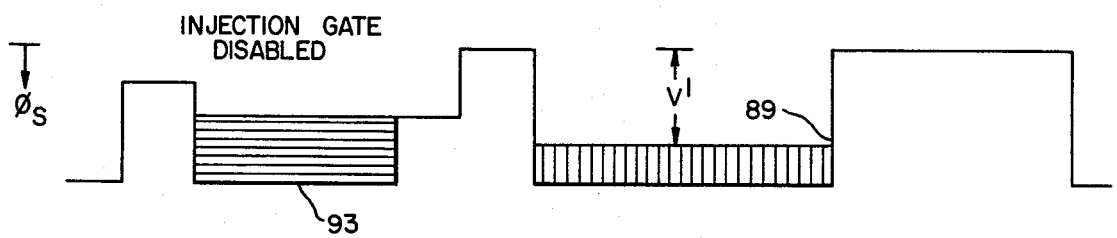

In the final step of operation as shown in FIG. 3D, the injection gate is disabled when the injection gate signal as shown in FIG. 4B returns to a more positive level, thereby raising a barrier across which the charges do not flow back into the holding well 93 beneath the electrode 84; if the charges were permitted to flow back, an extra uncertainty would be introduced into the signal processing. The barrier potential must rise slowly compared to the speed of charge flow forward into the receiving well 89. To help this forward flow of charges, the effective drain potential $V^1$, must be kept sufficiently below the effective source potential V− to provide the desired longitudinal drift fields from moving the charge forward in accordance with the following equation:

$$(V_+ - V_-) - V^1 > V_{MIN} \tag{12}$$

From equations (11) and (12), the capacitances are selected and thereby the area of the corresponding electrodes in the formation of the integrated circuit.

From equations (7) and (11), it is seen that the amount of charge injected is linearly related to the input signal voltage V− as shown in FIG. 4D by the factor of the capacitances (CH + C−). Since these capacitances are essentially determined by the characteristics of the silicon dioxide layer 74 and the silicon nitride layer 75, they are independent of the charge storage potential applied, giving the desired signal-voltage-to-injected-charge linearity to thereby meet one of the requirements for DASP.

After the charge packet has been transferred into the well beneath the $\phi_1$ electrode 92-$\phi_1$ of the first cell 14-1, the charge packet is transferred from well to well along the linear length of the CCD 10 under control of the phase clock signals $\phi_1$, $\phi_2$, $\phi_3$ and $\phi_4$, as shown respectively in FIGS. 4G to 4J. It is understood that the $\phi_1$, $\phi_2$, $\phi_3$ and $\phi_4$ clock signals are applied to the corresponding electrodes 92, 94, 96 and 98 of each of cells 14 of the CCD 10. Generally, the charge packet is transferred from well to well by an attractive voltage (shown in the waveforms of FIGS. 4G to 4J as a relatively low amplitude) applied to the next electrode, and thereafter applying a repulsive voltage (shown in the voltage waveforms as a relatively high amplitude) to the well from which the minority charge carriers are attracted. The transfer of the charge carriers from well to well is generally shown in FIGS. 4G to 4J by arrows indicating that the carriers are transferred from well to well beneath that electrode to which the corresponding phase clock signal is applied; the charge packet is further transferred from the well underneath the $\phi_4$ electrode of one cell to the well beneath the $\phi_1$ electrode of the next, successive cell 14.

Further experimentation with the CCD including the stabilized charge injector 12 as shown in FIG. 1 has revealed that improved operation is obtained if the gate electrodes 84 and 86 as seen in FIG. 2 are connected together for electrically common operation or as an alternative, are provided as a single electrode. Particularly, in the structure of FIG. 2, the bias voltage $V_H$ was a low, attractive voltage, typically in the range of the voltage $D_{IN}$ (i.e., the negative level value of the pulse voltage $D_{IN}$, $V_H$ being a steady DC bias value). The experimentation referred to revealed that the larger surface potential well produced by the separate voltage $V_H$ when applied to the separated electrode 84 introduced an increased charge uncertainty. This increased uncertainty can be visualized in the context that by having the two separately controlled electrodes 84 and 86, a large amount of charge and its associated noise was divided into two separate quantities under the respective electrodes. It was determined that the aforesaid electrical interconnection of the electrodes 84 and 86 avoids this increased charge uncertainty.

Figure 5A:
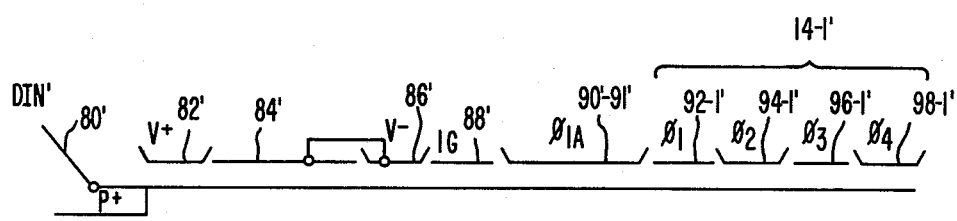
FIG. 5A comprises a schematic cross-section of a stabilized charge injector of an improved form in accordance with the invention.
Figure 5B:
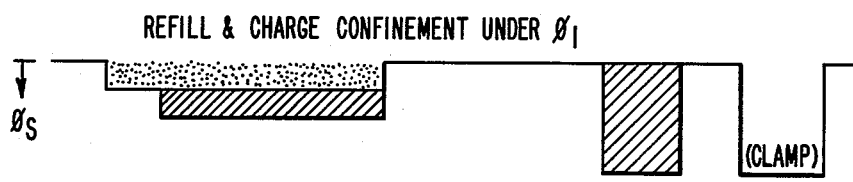
FIGS. 5B through 5E illustrate the charge profiles within the potential wells under the various electrodes shown in FIG. 5A.
Figure 5C:
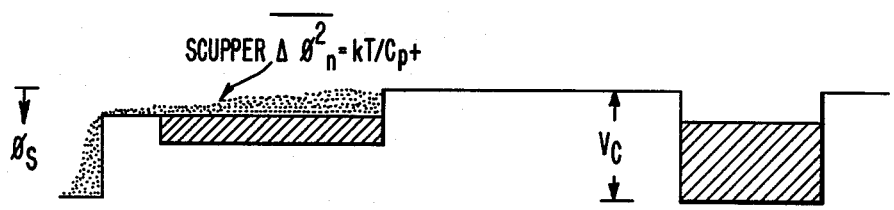
Figure 5D:
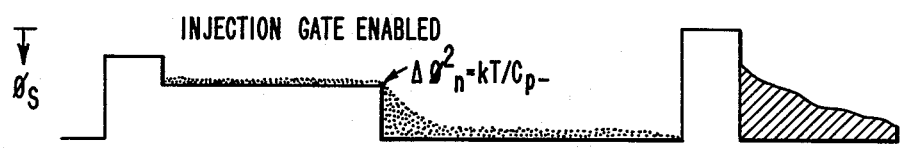
Figure 5E:
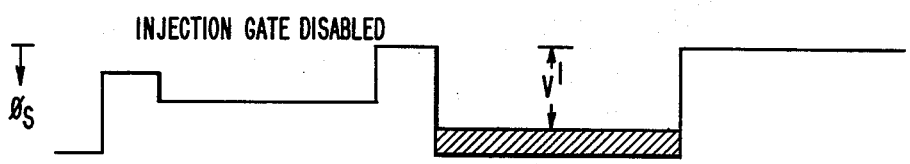

The further improvement of the SCI of the invention therefore is now more fully appreciated with reference to FIGS. 5A through 5E. FIG. 5A is a schematic view of the cross section of FIG. 2 in which like parts are labeled with corresponding, but primed numerals. To emphasize the feature of interconnecting the electrodes 84 and 86 of FIG. 2, these are still shown as separate electrodes 84' and 86' in FIG. 5 with an electrical interconnection. It follows that the prior bias voltage $V_H$ has been eliminated and both electrodes are operated in common in accordance with the voltage V− which may comprise the signal input. FIGS. 5B through 5E illustrate the resulting surface potential plots resulting from this modification disclosed in FIG. 5A and may be compared with FIGS. 3A through 3D, respectively. The comparison will reveal that the depth of the well under the now joined electrodes 84' and 86' has been reduced and, accordingly, the charge uncertainty and hence the noise as well has been reduced.

Accordingly, it will be appreciated from the foregoing that the invention has provided a technique and structure for accomplishing extremely low noise charge injection with improved linearity, far surpassing those charge injection techniques available with the prior art. The stabilized charge injector of the invention has application to substantially any type of charge transfer device, including a CCD device as specifically disclosed herein.

In view of the low noise presented by the SCI of the invention, it is highly suitable for use in parallel injection modes into a CCD channel. Such modes are typically employed where the channel is operated as a CCD shift register with parallel inputs (PI) and a serial output (SO). In the following, there is disclosed specific structure for accomplishing SCI in accordance with the invention and first and second applications of that structure with associated operating waveforms for affording desired timing of the charge injection in conjunction with the intended operation of the CCD shift register into which charge is to be injected. First, there is considered the effect of capacitance on uniformities of the charge injector structure and specific structure and operation for overcoming that charge uncertainty and the resultant noise which it presents. Then, a specific monolithic structure including an SCI of the invention for injection into a CCD shift register is disclosed and, finally, alternative modes of operation of that structure in accordance with successive charge injections timed in accordance with each shift cycle of the CCD shift register or, alternatively, successive charge injections at desired, time displaced intervals, are disclosed.

A significant source of noise in charge injection arises from the uncertainty associated with the input capacitance $C_{IN}$ and particularly input capacitance non-uniformities $C_{IN}$. Since input capacitance non-uniformities ($\Delta C_{IN}$) comprise the principal contribution to charge uncertainty in the injection it follows that for a large value of $C_{IN}$:

$$\Delta C_{IN}/C_{IN_k} <<< 1.$$

Therefore, to improve upon the accuracy and hence reduce the uncertainty of charge injection, a large value of input capacitance $C_{IN}$ is desired, requiring in turn large physical dimensions of the input capacitance. The large physical dimensions introduce a further problem, discussed hereinafter in detail, as to adequate speed of propagation of the charge from under the now large capacitance for injection into the CCD shift register. A solution for that problem is now set forth.

Figure 6A:
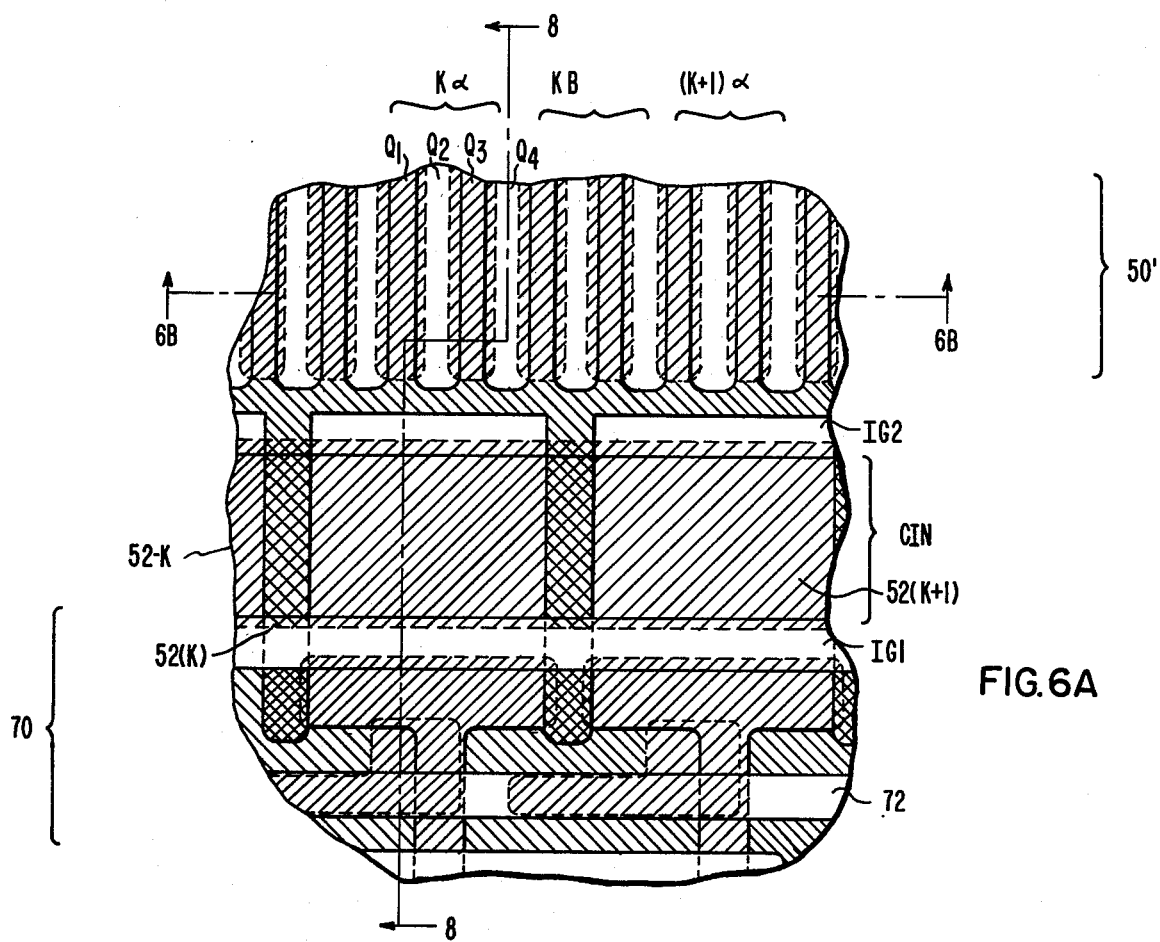
FIG. 6A is a plan view of a portion of a CCD monolithic structure including a portion of a CCD channel and a stabilized charge injector in accordance with the invention.

FIG. 6A is a plan view of a portion of the CCD monolithic structure including a CCD shift register 50' with the CCD channel having stages K, K, (K+1), ... The individual gate electrodes, arranged for four-phase clocking are illustrated at $\phi_1$ through $\phi_4$ and are included at each of the successive stages. The portion 70 comprises a stabilized charge injector for injecting charge into the CCD shift register 50'. It is to be recognized that FIG. 6A discloses a parallel injection arrangement, and that plural SCI structures 70 may be spaced along the CCD 50'.

The input gate 52(K) of stage (K) having the effective capacitance $C_{IN(K)}$ is seen in FIG. 6A to comprise a relatively large gate electrode 52(K). The gate 52(K+1) as well is seen corresponding to the next stage (K+1). Channel stop 53 separates and thereby isolates the adjacent gate electrodes, and hence the capacitances, to avoid any interaction therebetween. Channel stop 53 also extends in a "T" type configuration as seen in the drawing to include a portion extending from left to right above the conductor IG2. Gate conductor IG1 is also seen in the drawing. The areas V(K) + and V(K+L)+ are the signal input gates. Regions labeled PDIN(K) and PDIN(K+1) are the input diffusions, to be discussed. Element 72 is an aluminum stripe which extends across the areas PDIN and electrically ties them together.

Figure 6B:
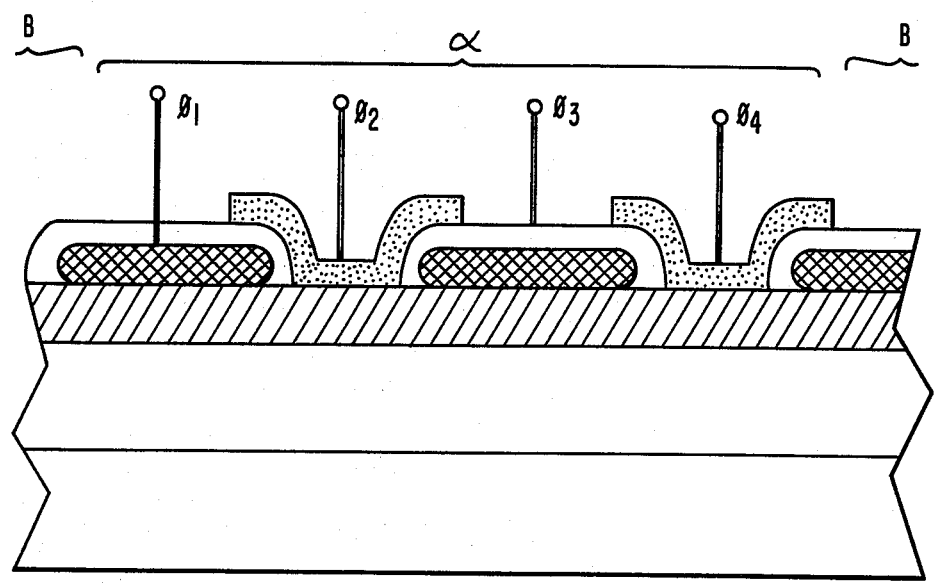
FIG. 6B is a cross-sectional view taken along the line 6B—6B in FIG. 6A.

FIG. 6B illustrates a cross-sectional view taken along the line 6B—6B in FIG. 6A to permit the reader to more readily visualize the arrangement of the successive electrodes $\phi_1$ to $\phi_4$ of the successive pairs of stages $\alpha$, $\beta$ as exist in the CCD shift register 50'.

Figure 9:
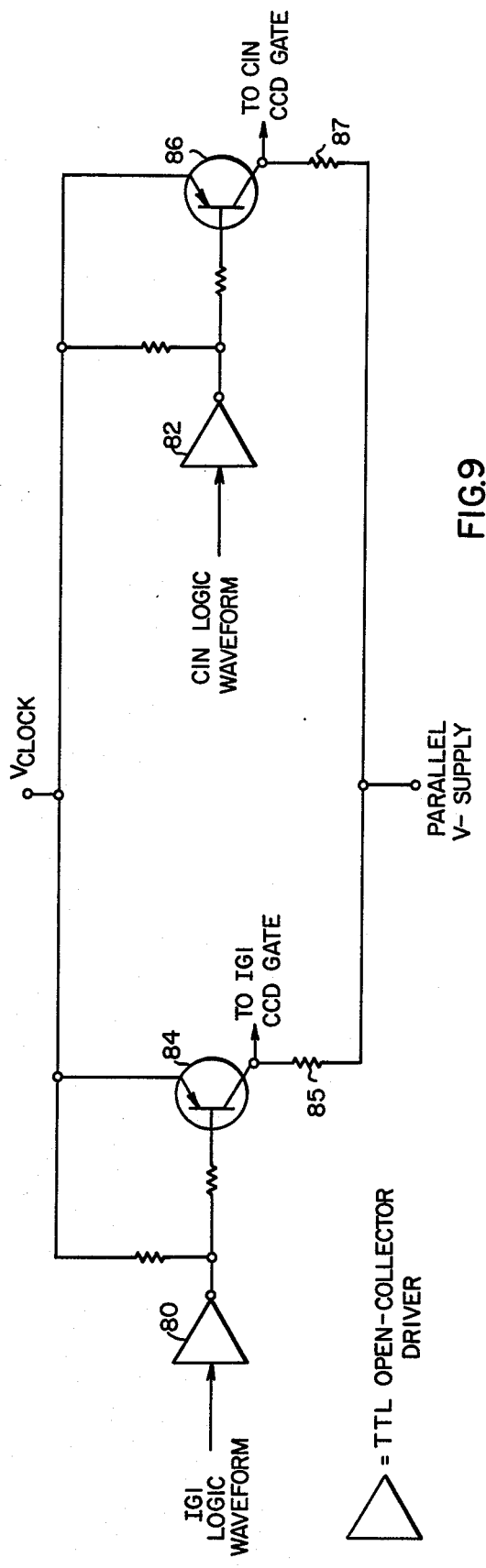
FIG. 9 is a schematic of a driving circuit for generating certain wave forms used for driving the structure of FIG. 6A.

The injection operation and the shift operation of the structure of FIGS. 6A and 6B will be more readily appreciated with reference to the waveforms of FIGS. 7A through 7H, the schematic cross-sectional illustration of FIG. 8, the latter indicating in essence a cross-sectional view along the line 8—8 in FIG. 6A, and a driving circuit the schematic of which is shown in FIG. 9.

In FIG. 6A, the regions PDIN correspond to the region P+ with the input $D_{IN}$ in FIG. 8, the region P+ acting as a source of minority carriers during the refill operation as seen in FIG. 8 and subsequently as a drain during the scupper period. The signal input is V+ in FIG. 8 and is correspondingly labeled for the stages (K) and (K+1) in FIG. 6A.

For reasons already explained, the capacitances CIN are of relatively large area, for example 70 microns in width and 56 microns in length, as those relative dimensions are illustrated in FIG. 6A. While this affords an improvement in noise reduction during charge injection, it creates a problem as to achieving adequate speed of propagation of the injected charges from under these large area capacitances into the CCD shift register. In that regard, from FIG. 6A it is to be appreciated that the charge propagates from the capacitor, for example, for the stage (K) into the gate electrodes $\phi_1$, $\phi_2$ and $\phi_3$ of the (K$\alpha$) stage. As will be seen, gate electrode $\phi_4$ creates a barrier during the injection of the charge into this region of the shift register stage.

To achieve adequate speed of propagation of the charges from under the input gate capacitances, successive gates IG1 and V− are provided, which effectively electrically separate the length of the gate capacitances to permit successive pushing of the charge packet from under each such capacitance into the respective receiving stage of the shift register.

With reference to FIGS. 7B and 7C, it will be seen that the signals IG1 and CIN become attractive simultaneously during the refill to attract charges from the P+ diffusion into the input capacitance. This flow of the charges would be into the area, or region, underlying the gates IGI and V− in FIG. 8. Excess charges are scuppered out from this region down to the level of the signal V+ and thus back into the P+ region which now acts as a drain.

The waveforms of FIGS. 7A through 7H illustrate a parallel injection function in which the parallel injection is to occur in each successive shift cycle, such as employed for a time delay and integrate (TDI) operation. (An alternative mode of operation will be discussed subsequently in relation to the waveforms of FIGS. 10A through 10H.

For convenience, the letter descriptions in the following refer both to the waveforms of FIGS. 7A to 7H and the gate structure of FIG. 8. IG1 goes high and therefore repulsive, pushing charges into the neighborhood of CIN. IG2 has become attractive, as have $\phi_1$, $\phi_2$, $\phi_3$. In succession, CIN and IG2 become repulsive, injecting the charges into the stage, then blocking off the parallel structure to permit a serial shift of the charge packets.

At the time of the first parallel injection, $\phi_4$ is repulsive and creates a barrier; $\phi_1$, $\phi_2$ and $\phi_3$ are attractive; and therefore the injection is achieved.

During the interval labeled "single serial shift," the injected charge is moved forward from a first stage to a subsequent stage of the CCD. Specifically, $\phi_1$, $\phi_2$ and $\phi_3$ successively become repulsive, and $\phi_4$ now is attractive, causing the charge to advance to the last portion of the first stage, i.e., that under the $\phi_4$ electrode. $\phi_1$ becoming attractive followed by $\phi_4$ becoming repulsive then corresponds to the charge packet moving into the next stage. Simultaneously, of course, charge injection is occurring into the first stage. For all except the first shift register, each parallel injection results in addition to the existing charge in the stage receiving the injection.

As before noted, there is a difficulty with a large input capacitance of assuring adequate speed of propagation of the charges. This is overcome in accordance with the effective electrical dividing of the capacitance by the special electrical pulsing technique relating to the signal waveforms IG1 and CIN. In essence, it is desired that the electrodes create a common potential while the charge is being initially set up in the underlying region, but then provide two successive pushes of the charges from that region during the charge injection operation.

This is accomplished in accordance with the circuit of FIG. 9. The IG1 and CIN logic waveforms are applied to TTL open collector drivers 80 and 82, respectively, the outputs thereof driving PNP transistors 84 and 86, respectively. The transistors 84 and 86 are connected at their emitters to a clock source and at their collectors to a parallel V− supply through resistors 85 and 87, respectively. During set-up of the charge in the common regions of IG1 and CIN, transistors 84 and 86 are effectively turned off by the corresponding logic waveforms applied thereto and, as a result, the outputs from their collectors through the respective resistors 85 and 87 are tied to the parallel V− supply, creating a common low-noise potential condition under these gates.

When IG1 goes high, (FIG. 7B), transistor 84 becomes conductive and hence its output at its collector terminal raises to the level of the clock: the clock presents a high repulsive level, producing the first push function. Subsequently, CIN goes high, turning on transistor 86 and raising its collector output across resistor 87 to the high repulsive level of the clock and providing the further push function.

An alternative mode of parallel charge injection may be achieved with the aforenoted structure wherein the timing of the injection may be selected independently, to some extent, of the normal shift cycle rate of the CCD shift register. Such an operation is useful, for example, where two input signals are to be supplied as successive injections into the CCD shift register.

Parallel charge injection for the two successive samples and the time-spaced interval during which it occurs is shown in relation to FIG. 10A through FIG. 10H. The timed displacement of the two sampling and corresponding injection operations may be selected as desired. As shown in FIGS. 10A to 10H, the second sampling initiates after PDIN for the second injection is completed. The duration of IG1 through $\phi_4$ for the first sample may be increased or decreased to alter correspondingly the time displacement. If a very long time displacement is necessary, in view of leakage non-uniformities for the $\alpha$ and $\beta$ packets, however, alteration of the clocking controls may be required. For convenience, the letter descriptions in the following refer both to the waveforms of FIGS. 10A to 10H and the gate structure of FIG. 6A. IG1 goes high and therefore repulsive, pushing charges into the neighborhood of CIN. IG2 has become attractive, as have $\phi_1$, $\phi_2$, and $\phi_3$. In succession, CIN and IG2 become repulsive, injecting the charges into the stage, then blocking off the parallel structure to permit a serial shift of the charge packets.

At the time of the first parallel injection, $\phi_4$ is repulsive and creates a barrier; $\phi_1$, $\phi_2$ and $\phi_3$ are attractive and therefore the injection is achieved.

Again referring to FIGS. 10A through 10H, during the interval labeled "single serial shift", the injected charge is moved forward from the $\alpha$ stage to the $\beta$ stage. Specifically, $\phi_1$, $\phi_2$ and $\phi_3$ successively become repulsive, and $\phi_4$ now is attractive, causing the charge to advance to the last portion of the $\alpha$ stage, i.e., that under the $\phi_4$ electrode. $\phi_1$ becoming attractive followed by $\phi_4$ becoming repulsive then corresponds to the charge packet moving into the $\beta$ stage of the $\alpha/\beta$ pair. At this juncture PDIN having occurred, the second parallel sampling may be initiated, followed by the second parallel injection into the $\alpha$ stage (i.e., repeating the preceding steps).

In accordance with the foregoing, there has been disclosed specific structure and modes of operation for parallel charge injection, affording substantially reduced noise. The SCI of the invention is useable for either serial or parallel injection into a CCD channel, such as a CCD shift register device. In addition to reduced noise, the CSI of the invention provides for injection of a charge linearly related to the input signal sample, and permits injecting a charge packet equal to the largest charge handling capability of the associated CCD. Numerous modifications and adaptations of the stabilized charge injection structure and technique, including mode of operation, of the invention will be apparent to those of skill in the art and thus it is intended by the appended claims to encompass all such modifications and adaptations as fall within the true spirit and scope of the invention.

We claim:

1. A stabilized charge injector for injecting a charge packet into a charge transfer device, the charge packet corresponding to the amplitude of an input signal supplied to said charge injector and being injected in a predetermined direction into said charge transfer device for propagation therein comprising:

means to effect said charge pocket transfer with low noise including;

a substrate having a main surface, an insulating layer deposited on said main surface of said substrate, said charge injector having an input portion and an output portion, said output portion communicating with a first potential receiving well established in a charge transfer device commonly formed on said insulating layer and substrate in association with said charge injector, said input portion of said charge injector including a diffusion in said substrate and an electrode extending through said insulating layer into direct electrical contact with said diffusion in said substrate, said diffusion alternately acting as a source and drain during an injection cycle, at least first and second electrodes extending transversely of said direction of injection through said injector, said first electrode being adjacent said diffusion, and said first and second electrodes having a differential DC bias, means for applying an input signal to one of said first and second electrodes, a gate electrode extending transversely of said direction of injection and adjacent said second electrode, and means for applying control signals to said diffusion, said first and second electrodes, and said gate electrode to enable said diffusion to act as a source of minority carriers for refilling the potential well defined by said first and second electrodes and subsequently to act as a drain for scuppering excessive charge carriers from the said potential well associated with said first and second electrodes to a level defined by the potential of said first electrode, said control means providing a control signal to said gate electrode to render the latter attractive for enabling the charge to flow into the receiving well of the charge transfer device and thereupon rendering said gate repulsive to confine said charge within said first receiving well of said charge transfer device, and means for increasing the speed of propagation of charge carriers by effectively dividing electrode capacitance.

2. A stabilized charge injector as recited in claim 1 wherein said scuppering continues until the surface potential under said second electrode equals the surface potential under said first electrode.

3. A stabilized charge injector as recited in claim 1 wherein said charge transfer device includes at least said first electrode on said insulating surface of said substrate disposed in parallel relationship to said gate electrode for defining said receiving well of said charge transfer device for receiving said charge when said gate electrode is enabled.

4. A stabilized charge injector as recited in claim 3 wherein there is further provided a further electrode intermediate said gate electrode and said first electrode of said charge transfer device, and said control means render said further electrode attractive subsequently to said gate electrode in permitting said flow of charges into said receiving well of said charge transfer device, and renders said gate electrode and said further electrode repulsive, in succession, to push said charges into said potential receiving well of said charge transfer device and to confine the charges therein.

5. A stabilized charge injector as recited in claim 1 wherein said charge transfer device includes a plurality of electrodes extending in parallel with, and at successive, laterally displaced positions from said gate electrode, and said control means applies clocking signals to said clocking electrodes of said charge transfer device for propagating the injected charge confined in the receiving well associated with said first electrode thereof through said charge transfer device.

6. A stabilized charge injector as recited in claim 1 wherein said charge transfer device includes plural groups of clocking electrodes, each said group defining a stage of said charge transfer device, said plural clocking electrodes being in parallel relationship and extending transversely of said electrodes of said stabilized charge injector, and said control means provides clocking signals to said electrodes of said charge transfer device of a format for defining said receiving potential well of said charge transfer device under more than one of said clocking electrodes of a stage of said charge transfer device for receiving said flow of charges during the enabling interval of said gate electrode.

7. A stabilized charge injector as recited in claim 6 wherein said control means provides clocking signals to said clocking electrodes of said charge transfer device in a continuous sequence establishing a predetermined shift cycle of charge packet propagation through each successive stage of said charge transfer device, and said clocking signals being generated in timed relationship to said control signals for said gate electrode of said charge injector so as to define said potential receiving well under selected ones of said group of plural electrodes of said associated stage and thereafter to propagate said charge packet along said selected plural electrodes of said group defining said receiving potential well, and then successively rendering the remaining successive electrodes of said group repulsive for isolating said propagating charge packet from said charge injector and continuing the propagation of said charge packet from said associated stage and through successive stages of said charge transfer device at said predetermined cyclic rate.

8. A stabilized charge injector as recited in claim 6 wherein said control means provides a first set of clocking signals to said electrodes of each said associated stage of said charge transfer device in association with said first charge injection and subsequently a second set of clocking signals to said electrodes of said charge transfer device for propagation of charges from each said associated stage and through successive said stages of said charge transfer devices, said control means being selectively operable to enable a first injection of charge from each said charge injector, as aforesaid, into the respectively associated potential receiving wells of said charge transfer device while generating said first set of clocking signals for rendering said selected electrodes of said group of plural electrodes of the associated stage attractive to define a receiving well and successively rendering said plural electrodes repulsive in sequence, to propagate said charge through said stage and to store said charge in a confined receiving well of said associated stage isolated from said charge injector, and said control means being subsequently selectively rendered operable to enable a further injection of charge from said charge injector into said potential receiving well of said stage associated with said charge injector and applying said first set of clocking signals to said electrodes of said associated stage of said charge injector for defining said potential receiving well and successively rendering said plural electrodes of said group of plural electrodes defining said receiving well repulsive to propagate said charge packet through said associated stage of said charge transfer device, and thereafter applying said second set of clocking signals to said group of plural electrodes of each said associated stage of said charge transfer device for propagating said first charge confined within said isolated receiving well of said stage to a next successive stage of said charge transfer device in advance of said second injected propagating charge propagating into said isolated receiving well and thereafter continuing the application of said second set of clocking signals to said electrodes of said charge transfer device for propagating said first and second charge packets, in succession, through said successive stages of said charge transfer device.

9. A stabilized charge injector for effecting parallel injection of charges into an associated stage of a charge transfer device having plural successive stages, each thereof defined by a corresponding number of clocking electrodes, selected ones of said electrodes being associated with said charge injector for defining a potential well thereunder for receiving an injected charge from said stabilized charge injector, wherein said stabilized charge injector comprises:

a diffusion acting alternately as a source and drain of the charge carriers of a charge packet to be injected, and in succession, a first electrode, a gate electrode, a second electrode of substantial area forming a large capacitance, a second gate electrode, and a third gate electrode, control means for selectively rendering said electrodes attractive and repulsive to the carriers to be injected, means for applying an input signal to one of said first and second electrodes, in response to said control means, said diffusion operating as a source of carriers and said first gate and second electrode being rendered attractive in succession to refill the potential well defined by said first gate and said second electrode with said charge carriers and said diffusion then operating as a drain to remove excess carriers in a scupper operation, said gate electrode remaining repulsive and in sequence, said second gate electrode being rendered attractive and said first electrode, said second electrode, and said third gate electrode being rendered repulsive for injecting charges into said receiving well of said charge transfer device, said control means provides clocking signals to said clocking electrodes of each of said stages of said charge transfer device in a continuous sequence establishing a predetermined shift cycle of charge packet propagation through each successive stage of said charge transfer device, and said clocking signals being generated in timed relationship to said control signals for said gate electrode of said charge injector so as to define said potential receiving well under selected ones of said group of plural electrodes of said associated stage and thereafter to propagate said charge packet along said selected plural electrodes of said group defining said receiving potential well, and then successively rendering the remaining successive electrodes of said group repulsive for isolating said propagating charge packet from said charge injector and continuing the propagation of said charge packet from said associated stage and through successive stages of said charge transfer device at said predetermined cyclic rate, and means for increasing the speed of propagation of charge carriers by effectively dividing electrode capacitance.

10. A stabilized charge injector for injecting charges into a receiving well of a charge transfer device and including a diffusion acting alternately as a source and drain of the charge carriers of a charge packet to be injected, and, in succession, a first electrode, a gate electrode, a second electrode of substantial area forming a large capacitance, and a second gate electrode, control means for selectively rendering said electrodes attractive and repulsive to the carriers to be injected, means for applying an input signal to one of said first and second electrodes, and in response to said control means, said diffusion, operating as a source of carriers and said first gate and second electrode being rendered attractive in succession to refill the potential well defined by said first gate and said second electrode then operating as a drain to remove excess carriers in a scupper operation, said gate electrode remaining repulsive and in sequence, said second gate electrode being rendered attractive and said first electrode, said second electrode, and said third gate electrode being rendered repulsive for injecting charges into a receiving well of said charge transfer device, and means for increasing the speed of propagation of charge carriers by effectively dividing electrode capacitance.

11. A stabilizied charge injector system for providing parallel injection of charge into corresponding stages of a charge transfer device, comprising:

a plurality of stabilized charge injectors disposed in side-by-side relationship on a common substrate with said charge transfer device for effecting parallel injection of charges into respectively associated stages of said charge transfer device, means deposited on said substrate to electrically isolate adjacent said parallel charge injectors, each of said stages of said charge transfer device including a group of plural electrodes of the same number per group and operable under control of clocking signals to propogate a charge through each said stage and through successive stages of said charge transfer device, each of said parallel charge injectors comprising a diffusion acting alternately as a source and drain of carriers of a charge packet to be injected, and, in succession, a first electrode, a gate electrode, a second electrode of substantial area forming a large capacitance, a second gate electrode, and a third gate electrode, means for applying an input signal sample to one of said first and second electrodes of each said injector, and control means for generating said clocking signals and for supplying control signals in common to all of said charge injectors for selectively and simultaneously rendering said electrodes of all said injectors attractive and repulsive to the carriers to be injected, and in response to said control means, said diffusion, operating as a source of carriers and said first gate and second electrode being rendered attractive in succession to refill the potential well defined by said first gate and said second electrode with said charge carriers and said diffusion then operating as a drain to remove excess carriers in a scupper operation, said gate electrode remaining repulsive and in sequence, said second gate electrode being rendered attractive and said first electrode, said second electrode, and said third gate electrode being rendered repulsive for injecting charges into a receiving well of said charge transfer device, and means for increasing the speed of propagation of charge carriers by effectively dividing electrode capacitance.

12. A stabilized charge injector system as recited in claim 11, each said injector thereof being operable for injecting charges into said respectively associated stages of said charge transfer device for summation of said injected charges with a charge packet propagating through said charge transfer device and thus in synchronized, timed relationship with the propagation of said charges through said charge transfer device wherein:

said control means provides clocking signals to said clocking electrodes of each of said stages of said charge transfer device in a continuous sequence establishing a predetermined shift cycle of charge packet propagation through each successive stage of said charge transfer device, and said clocking signals being generated in timed relationship to said control signals for said gate electrode of said charge injector so as to define said potential receiving well under selected ones of said group of plural electrodes of said associated stage and thereafter to propagate said charge packet along said selected electrodes of said group defining said receiving potential well, and then successively rendering the remaining successive electrodes of said group repulsive for isolating said propagating charge packet from said charge packet from said associated stage and through successive stages of said charge transfer device at said predetermined cyclic rate.

13. A parallel charge injection system as recited in claim 11 operable to effect selected, time-displaced first and second injections of charges into a respectively associated stage of said charge transfer device, said charge transfer device including a pair of associated first and second stages, each said stage including plural electrodes, and selected electrodes of said first stage defining said potential receiving well for receiving an injected charge from said associated stabilized charge injector and said second stage being disposed in a position isolated from said stabilized charge injector to receive a charge injected into said first stage in a successive single serial shift from said first stage and into said second stage during said second, time-displaced charge injection wherein:

said control means provides a first set of clocking signals to said electrodes of each said associated stage of said charge transfer device in association with said first charge injection and subsequently a second set of clocking signals to said electrodes of said charge transfer device for propagation of charges from each said associated stage and through successive said stages of said charge transfer devices, said control means being selectively operable to enable a first injection of charge from each said charge injector, as aforesaid, into the respectively associated potential receiving wells of said charge transfer device while generating said first set of clocking signals for rendering said selected electrodes of said group of plural electrodes of the associated stage attractive to define a receiving well and successively rendering said plural electrodes repulsive in sequence, to propagate said charge through said stage and to store said charge in a confined receiving well of said associated stage isolated from said charge injector, and said control means being subsequently selectively rendered operable to enable a further injection of charge from said charge injector into said potential receiving well of said stage associated with said charge injector and applying said first set of clocking signals to said electrodes of said associated stage of said charge injector for defining said potential receiving well and successively rendering said plural electrodes of said group of plural electrodes defining said receiving well repulsive to propagate said charge packet through said associated stage of said charge transfer device, and thereafter applying said second set of clocking signals to said group of plural electrodes of each said associated stage of said charge transfer device for propagating said first charge confined within said isolated receiving well of said stage to a next successive stage of said charge transfer device in advance of said second injected propagating charge propagating into said isolated receiving well and thereafter continuing the application of said second set of clocking signals to said electrodes of said charge transfer device for propagating said first and second charge packets, in succession, through said successive stages of said charge transfer device.

14. A method of controlling a stabilized charge injection for injecting charges into a receiving well of a charge transfer device, said charge transfer device including an input source/drain region contacted by a source/drain electrode, and, in succession, a first electrode, a first gate electrode, a second electrode, and a second gate electrode, capacitance means associated with said second electrode and said first gate electrode for increasing the speed of propagation of charges, wherein said method includes the steps of:

applying an input signal to one of said first and second electrodes, and applying control signals to said source/drain electrode to operate said region as a source of minority carriers;

rendering said first gate and said second electrode attractive in succession to fill the potential well defined by said first gate electrode and said second electrode with said charge carriers;

operating said diffusion region as a drain to remove excess carriers in a scupper operation, and a transfer process including maintaining said second gate electrode attractive and said first electrode, said second electrode, and said first gate electrode repulsive for injecting charges into a receiving well of said charge transfer device.

* * * * *